United States Patent [19]
Kasperkovitz

[11] Patent Number: 5,093,930
[45] Date of Patent: Mar. 3, 1992

[54] DIRECTLY MIXING SYNCHRONOUS AM RECEIVER

[75] Inventor: Wolfdietrich G. Kasperkovitz, Eindhoven, Netherlands

[73] Assignee: U.S. Philips Corporation, New York, N.Y.

[21] Appl. No.: 427,673

[22] Filed: Oct. 25, 1989

[30] Foreign Application Priority Data

Nov. 28, 1988 [NL] Netherlands ................. 8802917

[51] Int. Cl.$^5$ ............................................. H04B 1/06
[52] U.S. Cl. .................................. 455/45; 455/260; 455/237; 331/15
[58] Field of Search ............... 455/45, 195, 196, 200, 455/236, 246, 250, 251, 256, 257, 260, 264, 337, 226, 237; 331/17, 15; 329/325, 360

[56] References Cited

U.S. PATENT DOCUMENTS

| | | | |
|---|---|---|---|
| 3,209,271 | 9/1965 | Smith | 329/325 |
| 4,355,417 | 10/1982 | Kozak, Jr. | 455/237 |
| 4,473,801 | 9/1984 | Maurer et al. | 329/360 |
| 4,631,499 | 12/1986 | Kasperkovitz | 329/360 |
| 4,816,771 | 3/1989 | Roza | 330/9 |
| 4,864,840 | 9/1989 | Roza | 455/260 |
| 4,953,182 | 8/1990 | Chung | 455/260 |
| 4,972,163 | 11/1990 | Van Der Plas | 331/17 |

*Primary Examiner*—Curtis Kuntz
*Assistant Examiner*—Edward Urban
*Attorney, Agent, or Firm*—Edward W. Goodman

[57] ABSTRACT

A directly mixing synchronous AM receiver includes a synchronous demodulator coupled to an antenna input for synchronously demodulating an RF-AM reception carrier and a phase-locked loop (PLL) incorporating a phase detection arrangement, a loop filter, a controllable oscillator which is coupled to the synchronous demodulator via an in-phase output and to the phase detection arrangement via a quadrature output. In order to increase the dynamic range of the receiver, it is provided with a controllable amplification arrangement in the phase-locked loop to which a gain control signal is applied from a control signal generating circuit for reducing field strength-dependent amplitude variations of the signal in the phase-locked loop. The control signal generating circuit includes mixing device having in succession, mutually coupled first and second mixer stages, to which first mixer stage a first mixing subcarrier as applied from a signal generator, the antenna input being connected to an input of one of the first and second mixer stages and the in-phase output of the controllable oscillator being connected to an input of the other mixer stage, the mixing device being coupled via an output of the second mixer stage to a selection circuit for selecting at least the frequency of the first mixing subcarrier, followed by an amplitude detection arrangement for detecting the amplitude of the first mixing subcarrier, the amplitude detection arrangement being coupled to a control input of the controllable amplification arrangement.

10 Claims, 1 Drawing Sheet

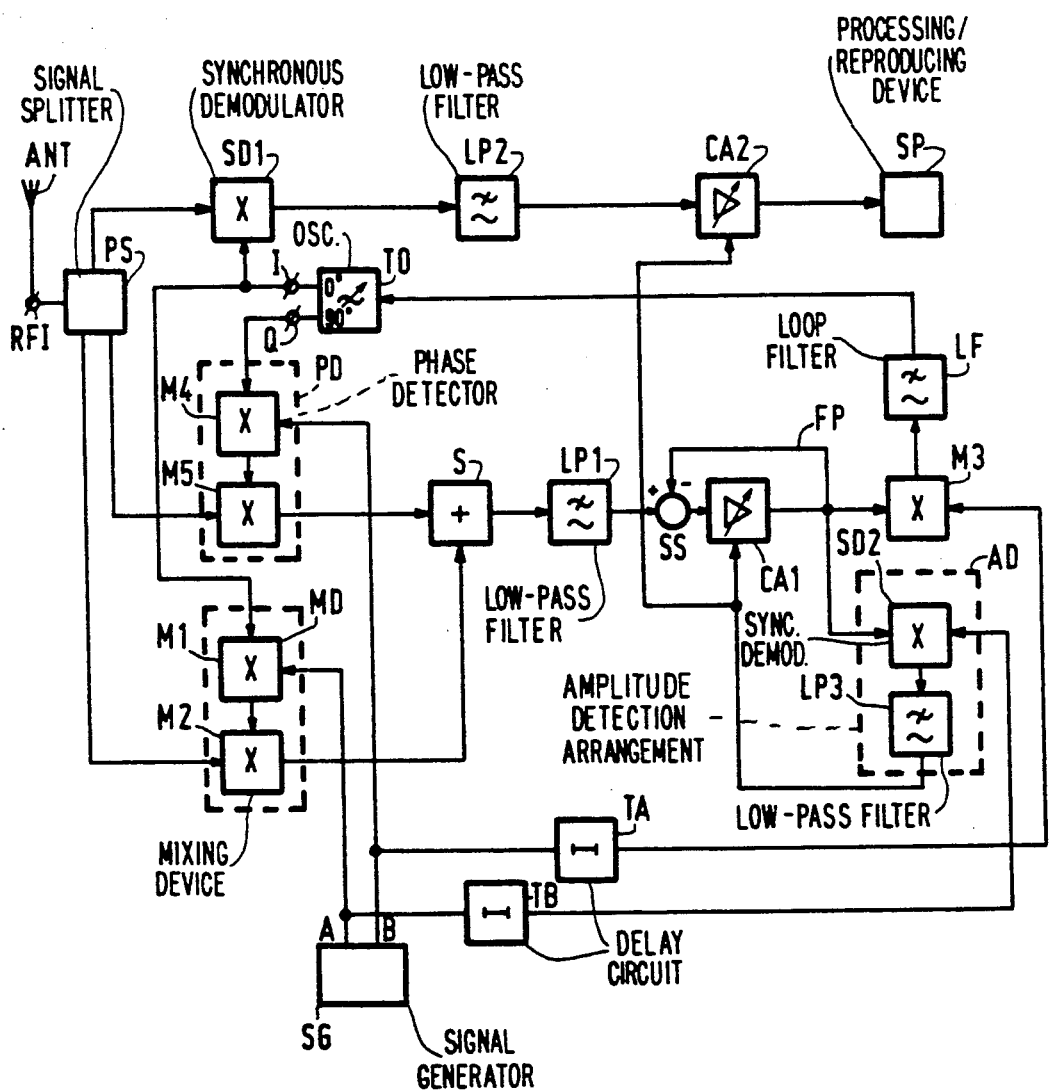

DIRECTLY MIXING SYNCHRONOUS AM RECEIVER

BACKGROUND OF THE INVENTION

1. Field of the Invention

The invention relates to a directly mixing synchronous AM receiver comprising a synchronous demodulator coupled to an antenna input for synchronously demodulating an RF-AM reception carrier, and a phase-locked loop (PLL) incorporating a phase detection arrangement, a loop filter, a controllable oscillator which is coupled to the synchronous demodulator via an in-phase output and to the phase detection arrangement via a quadrature output.

2. Description of the Related Art

A directly mixing synchronous AM receiver of this type is known from U.S. Pat. No. 4,631,499 (PHN 11, 220).

The phase-locked loop of the directly mixing synchronous AM receiver is used for regenerating a local mixing carrier which is applied to the synchronous demodulator via the in-phase output of the controllable oscillator and which should accurately follow the phase of the RF-AM reception carrier for the purpose of a correct synchronous demodulation of this carrier.

However, in practice a phase error is produced between these two carriers due to different factors such as, for example, an unwanted parasitic DC offset of the phase control signal for which the above-mentioned prior art provides a solution. Another important factor is the field strength-dependent conversion gain in the phase detection arrangement so that the phase control signal in the loop not only depends on the phase difference between the two carriers applied to the phase detection arrangement, but also on the amplitude, i.e. field strength of the RF-AM reception signal.

The field strength dependence of the phase control signal can be reduced by means of an automatic gain control arrangement before or in the loop in such a way that a stable, accurate phase synchronism between the two carriers is obtained within a certain range of field strength variation or dynamic range of the receiver. A field strength indication is derived from the amplitude level, which is average over a given period of time, of the demodulated RF-AM reception carrier at the output of the synchronous demodulator and is applied as a DC gain control signal to the gain control arrangement. However, it has been found that the feasible dynamic range is comparatively small with such known automatic gain controls.

SUMMARY OF THE INVENTION

It is an object of the invention to increase the dynamic range of the known directly mixing synchronous AM receiver.

According to the invention a directly mixing synchronous AM receiver of the type described in the opening paragraph is characterized by a controllable amplification arrangement in the phase-locked loop to which a gain control signal is applied from a control signal generating circuit for reducing field strength-dependent amplitude variations of the signal in the phase-locked loop, a mixing device comprising, in succession mutually coupled first and second mixer stages, to which first mixer stage a first mixing subcarrier is applied from a signal generator, the antenna input being connected to an input of one of the first and second mixer stages and the in-phase output of the controllable oscillator being connected to an input of the other mixer stage, said mixing device being coupled via an output of the second mixer stage to selection means for selecting at least the frequency of the first mixing subcarrier, followed by an amplitude detection arrangement for detecting the amplitude of the first mixing subcarrier, said amplitude detection arrangement being coupled to a control input of the controllable amplification arrangement.

A synchronous AM demodulator using an automatic gain control in the phase-locked loop is known per se from U.S. Pat. No. 4,473,801. The gain control signal is derived from the DC component of the baseband modulation signal, which signal is obtained by a mixing conversion of an RF-AM input signal, or, for example, an AM-IF reception signal with the local mixing carrier in a single mixer stage functioning as a mixing device.

The invention is based on the recognition that the control range of such a known automatic gain control and hence the dynamic range of the receiver is limited because not only the desired DC component, from which the gain control signal is derived, occurs at the output of the known mixing device, but also an unwanted DC offset which may be many times larger than the desired DC component, particularly in RF-AM input signals having a comparatively small amplitude or field strength.

When using the measure according to the invention, the field strength information is not laid down in the amplitude of a DC component but in the amplitude of an AC component, i.e. the amplitude of the first mixing subcarrier. The influence of the unwanted DC offset on the gain control is reduced by a frequency-dependent selection of this first mixing subcarrier. A reliable field strength indication is obtained by means of an amplitude detection of the subcarrier thus selected, also for a relatively weak signal reception which is located beyond the control range of the known automatic gain control. By applying this field strength indication as a gain control signal to the controllable amplification arrangement, the dynamic range of the directly mixing synchronous AM receiver according to the invention is considerably larger than that of the known receiver.

In order to prevent noticeable perturbations in the production of the baseband modulation signal, for example whistling in the case of use as a radio receiver, the mixing device is only used for generating the gain control signal and not simultaneously for synchronously demodulating the baseband demodulation signal to be reproduced.

A further increase of the dynamic range of the directly mixing synchronous AM receiver according to the invention is possible by reducing also the influence of the unwanted DC offset, which occurs in the phase detection arrangement, on the phase control signal in the loop in accordance with the measure known from the first-mentioned prior art.

Such a directly mixing synchronous AM receiver according to the invention is preferably characterized in that the phase detection arrangement comprises means for modulating the phase information on a second mixing subcarrier, in that the phase-locked loop incorporates, between the phase detection arrangement and the loop filter, successively, an adder circuit for adding the output signals of the phase detection arrangement and the mixing device, the selection means, the controllable amplification arrangement and a third mixer stage for demodulating the second mixing subcarrier, said selection means also selecting the frequency of the second mixing subcarrier and an output of the controllable amplification arrangement being coupled to an input of the said amplitude detection arrangement.

This measure is based on the recognition that a common selection of the field strength information and the phase information after the mixing operation in the mixing device and the phase detection arrangement is possible by modulating this information on two mixing subcarriers which mutually differ in frequency and/or phase.

When using the measure according to the invention, the selection means in the loop are operative for selecting both the field strength and the phase information and the measure according to the invention is advantageously combined with the afore-mentioned known measure.

A further preferred embodiment is characterized in that the amplitude detection arrangement has a sixth mixer stage to which the first mixing subcarrier is applied which, with respect to the mixing subcarrier applied to the first mixer stage, is delayed over a delay period which substantially corresponds to the delay of the signal in the phase-locked loop between the phase detection arrangement and the sixth mixer stage, said sixth mixer stage being coupled to the control input of the controllable amplification arrangement via a low-pass filter.

This provides an accurate synchronous AM detection of the field strength information.

BRIEF DESCRIPTION OF THE DRAWING

Embodiments of the invention will now be described in greater detail with reference to the accompanying drawing, which includes a sole FIGURE showing a concise block schematic diagram of a directly mixing synchronous AM receiver according to the invention.

DESCRIPTION OF THE PREFERRED EMBODIMENT

In the FIGURE, an RF-AM reception signal from an antenna device ANT is applied to an RF input RFI of a signal splitter PS which is coupled to a synchronous demodulator SD1, a phase detection arrangement PD and a mixing device MD and which applies substantially 80%, 10% and 10%, respectively, of the received RF signal energy thereto.

Together with a cascade arrangement of circuits S, LP1, SS, CA1, M3, a loop filter LF and a controllable tuning oscillator T0, the phase detection arrangement PD constitutes a phase-locked loop. The controllable tuning oscillator T0 is connected to the synchronous demodulator SD1 via an in-phase output (0°) and to the phase detection arrangement PD via a quadrature output (90°) and applies thereto a local in-phase and a local quadrature carrier, respectively, which are mutually in phase quadrature and whose frequency is tunable at the carrier frequency of a desired RF-AM reception signal.

When tuning to a desired RF-AM reception carrier, the phase detection arrangement PD supplies a phase control signal which varies with phase differences deviating from 90° between this RF-AM reception carrier and the local quadrature carrier and which is applied to the controllable tuning oscillator T0 via a selection in the loop filter LF in such a way that these phase differences are reduced. In the phase-locked state of the loop the local in-phase carrier is therefore substantially in phase or in anti-phase with the RF-AM reception carrier in the case of a sufficiently large reception field strength, so that this RF-AM reception carrier is correctly demodulated synchronously to the baseband in the synchronous demodulator SD1. The baseband demodulation signal thus obtained is automatically stabilized in amplitude in a controlled amplifier CA2 after a selection in a low-pass filter LP2 and is subsequently further processed and reproduced in a processing and reproducing device SP.

The mixing device MD of the directly mixing synchronous AM receiver shown forms part of a control signal generating circuit for generating a gain control signal for an automatic amplification arrangement CA1, which is incorporated in the loop and which will be further described, and comprises in succession mutually coupled first and second mixer stages M1 and M2. The local in-phase carrier is applied to the first mixer stage M1 via the in-phase output of the controllable tuning oscillator T0 and a first mixing subcarrier A is applied from a signal generator SG. The output signal of M1 is applied to the second mixer stage M2, i.e. a product of the local in-phase carrier and the first mixing subcarrier A, and the RF-AM reception signal is applied from PS. In contrast to the synchronous demodulation of the RF-AM reception carrier in SD1, a conversion to the frequency of the first mixing subcarrier A is obtained in MD instead of a conversion to the baseband. Therefore, the first mixing subcarrier A which is amplitude-modulated with the AM modulation and also with the field strength of the RF-AM reception carrier, and an unwanted DC offset caused by bias and/or circuit asymmetries, notably in the second mixer stage M2 appear at the output of M2 which is also the output of the mixing device MD.

In the embodiment shown, the output signal of M2 is introduced into the phase-locked loop via an adder circuit S connected to the output of PD and is subsequently applied to the selection means incorporated in the loop, comprising a low-pass filter LP1 followed by the above-mentioned controllable amplification arrangement CA1 with a DC negative feedback FP, SS. This DC negative feedback is obtained by applying the DC component in the output signal of CA1 to a subtractor stage SS via a DC feedback path FP, said subtractor stage SS being arranged between LP1 and CA1, by subtracting the last-mentioned DC component in the subtractor stage SS from the output signal of LP1 and by applying this difference to the input of CA1. In the low-pass filter LP1, higher order product components are suppressed, which components have been produced during the mixing operation in the mixing device MD and components which have been produced in the phase detection arrangement PD, while inter alia the above-mentioned unwanted DC offset is suppressed by means of the said DC negative feedback. The selected amplitude-modulated first mixing subcarrier at the output of the controllable amplification arrangement CA1 is subsequently applied to an amplitude detection arrangement AD comprising a synchronous demodulator SD2, followed by a low-pass filter LP3. The first mixing subcarrier delayed over $\tau a$ delay period a is applied to the synchronous demodulator SD2 from the signal generator SG via a delay circuit TA. The delay period $\tau a$ is chosen to be substantially equal to the signal delay which occurs in the signal path between MD and SD2, so that the amplitude of the RF-AM reception signal modulated on the first mixing subcarrier is correctly demodulated synchronously in SD2. This amplitude or field strength of the RF-AM reception signal is subsequently applied as a gain control signal to a control input of the controllable amplification arrangement CA1 after a selection in the low-pass filter LP3 coupled to SD2, so that a negative feedback of field strength-dependent amplitude variations is produced in the gain control loop thus formed.

Due to the suppression, notably of the unwanted DC offset in the DC negative feedback FP, SS of CA1, the negative feedback of field strength-dependent amplitude variations subsists, even at very small field strength values. Such small field strength values result at the output of M2 in a signal level which is considerably smaller than the level of the unwanted DC offset occurring in M2. Consequently, the loop properties remain optimum within a much larger dynamic range than in conventional directly mixing synchronous AM receivers.

The gain control signal is also applied to a control input of the controllable amplifier CA2 so that the reproduction quality of the desired baseband modulation signal within a large dynamic range is not influenced by the field strength. It is evident that the above-mentioned derivation of the field strength indication from the output signal of MD is also possible by incorporating the part of the control signal generating circuit, constituted by the selection means LP1, CA1, FP, SS and the amplitude detection arrangement AD, together with MD in a separate control signal generating circuit outside the phase-locked loop and by controlling a controllable amplifier incorporated in the loop by means of the gain control signal.

Incorporation of the part of the control signal generating circuit in the loop, as shown in the Figure, provides the possibility of also reducing the unwanted DC offset occurring during the mixing conversion in the phase detection arrangement PD with respect to the phase information while using a minimum number of mixer stages in the loop. It is known from U.S. Pat. No. 4,631,499 that this is achieved by modulating this phase information on a mixing subcarrier hereinafter referred to as second mixing subcarrier B, by subsequently selecting and simultaneously suppressing and demodulating the unwanted DC offset so that the phase information in the form of a DC signal becomes available and is applied as a DC phase control signal to the controllable tuning oscillator T0.

To this end, the phase detection arrangement PD comprises, in succession, mutually coupled fourth and fifth mixer stages M4 and M5, the local quadrature mixing carrier being applied to the said fourth mixer stage M4 from the quadrature output (90°) of T0 and the second mixing subcarrier B being applied to said stage from the signal generator SG. The mixing product of the two last-mentioned carriers, on the one hand, and the RF-AM reception carrier from PS, on the other hand, are applied to the fifth mixer stage M5. The output of M5, which is also an output of PD, supplies the second mixing subcarrier B on which the desired information about the phase difference deviating from 90° between the local quadrature carrier and the RF-AM reception carrier is modulated, as well as the unwanted DC offset which is produced as a result of bias voltage and/or circuit asymmetries, notably in the fifth mixer stage M5 and unwanted higher order mixing products. The unwanted signal components are suppressed with respect to the desired second mixing subcarrier B by means of LP1 and the DC negative feedback of CA1. The phase information modulated on the second mixing subcarrier B is synchronously demodulated in the mixer stage M3, followed by a low-pass selection in the loop filter LF. For a further explanation of the reduction of DC offset in the phase control signal reference is made to U.S. Pat. No. 4,631,499.

The mixing carrier required for the synchronous demodulation in M3 is derived from B by a given delay τb in a delay circuit TB arranged between SG and M3. The delay τb is chosen to be equal to the signal delay which occurs in the circuits between PD and M3. Since the last-mentioned circuits are also operative for the reduction of unwanted DC and higher order product components in the gain control signal, τb should be equal to the delay τa in TA. In the case of suitably chosen subcarriers A and B, the delay circuits TA and TB may also be replaced by a single common delay circuit T. However, to prevent the phase information in the combination shown from being inseparably combined with the field strength information, the mixing subcarriers should at least comprise a component without any correlation and should be, for example, mutually different in frequency or in phase.

Those skilled in the art will recognize that different modifications are possible for the above-described embodiment without passing beyond the scope of the invention, for example for satisfying special applications. For example, the unwanted DC offset component in the gain control signal according to the invention can be reduced independently of the above-mentioned known measure of reducing the unwanted DC offset component of the phase control signal. Instead of a synchronous detection in SD2, it is also possible to detect the amplitude of the first mixing subcarrier A by means of a quadratic detection (not shown), in which the first mixing subcarrier A to be detected is multiplied by itself in a multiplier circuit, or by means of peak detection (not shown) so that the necessity of a carrier A delayed over τa can be dispensed with in each of these cases, and it is possible to use a bandpass filter instead of a low-pass filter LP1 and a DC negative feedback across CA1 via FP and SS, and/or instead of forming a mixing product in M1 of the local in-phase (0°) mixing carrier of T0 with the first mixing subcarrier A followed by mixing this mixing product in M2 with the RF-AM reception carrier, to form a mixing product in M1 of the RF-AM reception carrier with the first mixing subcarrier A followed by mixing this last-mentioned mixing product in M2 with the local inphase (0°) mixing carrier of T0. It is therefore obvious that the Claims should not be limited to the special embodiment shown.

I claim:

1. A directly mixing synchronous AM receiver having a synchronous demodulator coupled to an antenna input for synchronously demodulating an RF-AM reception carrier, and a phase-locked loop including a phase detection arrangement, a loop filter, and a controllable oscillator, said controllable oscillator being coupled to the synchronous demodulator via an in-phase output and to the phase detection arrangement via a quadrature output, characterized in that said receiver further comprises:

a controllable amplification arrangement included in said phase-locked loop, said controllable amplification arrangement having a control input for receiving a gain control signal; and a control signal generating circuit for reducing field strength-dependent amplitude variations of the signal in the phase-locked loop, said control signal generating circuit generating said gain control signal for said controllable amplification arrangement, and comprising:

a signal generator for generating a mixing subcarrier;

a mixing device having, in succession, mutually coupled first and second mixer stages, said first mixer stage receiving said mixing subcarrier, the antenna input being connected to an input of one of the first and second mixer stages and the in-phase output of the controllable oscillator being connected to an input of the other of said first and second mixer stages;

selection means coupled to an output of said second mixer stage for selecting at least the frequency of the mixing subcarrier; and an amplitude detection arrangement coupled to an output of said selection means for detecting the amplitude of the mixing subcarrier, said amplitude detection arrangement being coupled to the control input of said controllable amplification arrangement.

2. A directly mixing synchronous AM receiver as claimed in claim 1, characterized in that the phase detection arrangement comprises means for modulating the phase information on a further mixing subcarrier generated by said signal generator, in that the phase-locked loop incorporates, between the phase detection arrangement and the loop filter, successively, and adder circuit for adding the output signals of the phase detection arrangement and the second mixer stage, said selection means, the controllable amplification arrangement, and a third mixer stage for demodulating the further mixing subcarrier, said selection means also selecting the frequency of the further mixing subcarrier, and an output of the controllable amplification arrangement being coupled to an input of the said amplitude detection arrangement.

3. A directly mixing synchronous AM receiver as claimed in claim 2, characterized in that the phase detection arrangement comprises, in succession, mutually coupled fourth and fifth mixer stages, the further mixing subcarrier being applied to said fourth mixer stage, the antenna input being connected to one of the fourth and fifth mixer stages and the quadrature output of the controllable oscillator being connected to the other of the fourth and fifth mixer stages, the further mixing subcarrier being applied via a delay circuit to said third mixer stage, said delay circuit having a delay period which substantially corresponds to the delay of the signal in the phase-locked loop between the phase detection arrangement and the third mixer stage.

4. A directly mixing synchronous AM receiver as claimed in claim 2 or 3, characterized in that the mixing subcarriers mutually correspond in frequency and differ in phase.

5. A directly mixing synchronous AM receiver as claimed in claim 4, characterized in that the amplitude detection arrangement has a sixth mixer stage to which the mixing subcarrier is applied via a delay circuit having a delay period which substantially corresponds to the delay of the signal in the phase-locked loop between the phase detection arrangement and the sixth mixer stage, said sixth mixer stage being coupled to the control input of the controllable amplification arrangement via a low-pass filter.

6. A directly mixing synchronous AM receiver as claimed in claim 5, characterized in that the selection means comprises a low-pass filter, and the controllable amplification arrangement is provided with a DC negative feedback.

7. A directly mixing synchronous AM receiver as claimed in claim 4, characterized in that the selection means comprises a low-pass filter, and the controllable amplification arrangement is provided with a DC negative feedback.

8. A directly mixing synchronous AM receiver as claimed in claim 2 or 3, characterized in that the amplitude detection arrangement has a sixth mixer stage to which the mixing subcarrier is applied via a delay circuit having a delay period which substantially corresponds to the delay of the signal in the phase-locked loop between the phase detection arrangement and the sixth mixer stage, said sixth mixer stage being coupled to the control input of the controllable amplification arrangement via a low-pass filter.

9. A directly mixing synchronous AM receiver as claimed in claim 8, characterized in that the selection means comprises a low-pass filter, and the controllable amplification arrangement is provided with a DC negative feedback.

10. A directly mixing synchronous AM receiver as claimed in claims 2 or 3, characterized in that the selection means comprise a low-pass filter, and the controllable amplification arrangement is provided with a DC negative feedback.

* * * * *